(12) United States Patent
Abella et al.

(10) Patent No.: US 7,447,054 B2
(45) Date of Patent: Nov. 4, 2008

(54) NBTI-RESILIENT MEMORY CELLS WITH NAND GATES

(75) Inventors: Jaume Abella, Barcelona (ES); Xavier Vera, Barcelona (ES); Osman Unsal, Barcelona (ES); Antonio Gonzalez, Barcelona (ES)

(73) Assignee: Intel Corporation, Santa Clara, CA (US)

( * ) Notice: Subject to any disclaimer, the term of this patent is extended or adjusted under 35 U.S.C. 154(b) by 18 days.

(21) Appl. No.: 11/611,344

(22) Filed: Dec. 15, 2006

(65) Prior Publication Data

US 2008/0084732 A1    Apr. 10, 2008

(30) Foreign Application Priority Data

Sep. 28, 2006    (WO) ............... PCT/ES2006/000542

(51) Int. Cl.
*G11C 17/00*    (2006.01)
(52) U.S. Cl. ................... 365/104; 365/72; 365/154
(58) Field of Classification Search ........... 354/104, 354/154, 72
See application file for complete search history.

(56) References Cited

U.S. PATENT DOCUMENTS 4,887,242 A * 12/1989 Hashimoto ............. 365/185.29
6,671,202 B1 * 12/2003 Bauer ..................... 365/154
2006/0028861 A1 * 2/2006 Han et al. ................ 365/154

OTHER PUBLICATIONS

M.A. Alam. A Critical Examination of the Mechanics of Dynamic NBTI for PMOSFETs. In Proceedings of the IEEE International Electron Devices Meeting (IEDM'03), 2003.
S.V. Kumar, C.H. Kim, S.S. Sapatnekar. Impact of NBTI on SRAM Read Stability and Design for Reliability. In Proceedings of the International Symposium on Quality Electronic Design (ISQED'06), 2006.
M. Powell, S.H. Yang, B. Falsafi, K. Roy, T.N. Vijaykumar. Gated-Vdd: A Circuit Technique to Reduce Leakage in Deep-Submicron Cache Memories. In Proceedings of the International Symposium on Low Power Electronics and Design (ISLPED'00), 2000.

* cited by examiner

*Primary Examiner*—Thong Q Le
(74) *Attorney, Agent, or Firm*—Carrie A. Boone, P.C.

(57) ABSTRACT

An NBTI-resilient memory cell is made up of a ring of multiple NAND gates. The NAND gates are arranged such that one of the NAND gates has a "0" in its output, while the remaining NAND gates have a "1" in their outputs. PMOS transistors within the memory cell experience less degradation than in inverter-based memory cells. Guard-banding to account for transistor degradation may be mitigated, or the operating frequency of the memory cell may be increased.

20 Claims, 12 Drawing Sheets

← 92

← 96

← 94

US 7,447,054 B2

NBTI-RESILIENT MEMORY CELLS WITH NAND GATES

CLAIM OF PRIORITY

This application claims priority to PCT Application No. PCT/ES2006/000542, filed on Sep. 28, 2006.

TECHNICAL FIELD

This disclosure relates to memory cells and, more particularly, to the avoidance of transistor failure within memory cells.

BACKGROUND

As circuit technology evolves, transistors shrink, whether in length, width, or thickness. Transistor shrinkage may cause one or more effects that negatively affect operation of the circuit. A phenomenon, known as negative bias temperature instability (NBTI), is one source of transistor failure. NBTI occurs in p-type metal oxide semiconductor (PMOS) transistors whenever the voltage at the gate is negative (logic input "0"). NBTI causes degradation of the transistor, which shortens its usable life.

Like other transistor-based circuits, memory cells are adversely affected by the NBTI phenomenon. Although variations exist, typical memory cells consist of two inverters, arranged such that the output of a first inverter is coupled to the input of a second inverter, and vice-versa. With such a configuration, one of the inverters has a negative voltage (logic input "0") at its input at all times, resulting in NBTI degradation. The best-case degradation occurs when the value of each inverter is "0" 50% of the time, meaning that both PMOS transistors degrade at the same rate. Because of the configuration of the memory cells, achieving a degradation rate below 50% is unfeasible.

Thus, there is a continuing need to address the NBTI-related issues associated with memory cells.

BRIEF DESCRIPTION OF THE DRAWINGS

The foregoing aspects and many of the attendant advantages of this disclosure will become more readily appreciated as the same becomes better understood by reference to the following detailed description, when taken in conjunction with the accompanying drawings, wherein like reference numerals refer to like parts throughout the various views, unless otherwise specified.

DETAILED DESCRIPTION

In accordance with the embodiments described herein, an NBTI-resilient memory cell is disclosed, in which the back-to-back inverter arrangement common in prior art memory cells is replaced with a ring of multiple NAND gates. Within the novel memory cell, NAND gates are arranged such that one of the NAND gates has a "0" in its output, while the remaining NAND gates have a "1" in their outputs. Using the novel memory cell, degradation rates are reduced. Because of this benefit, guard-banding to account for transistor degradation may be avoided or lessened with the novel memory cell, or the operating frequency of the memory cell may be increased.

In the following detailed description, reference is made to the accompanying drawings, which show by way of illustration specific embodiments in which the described subject matter may be practiced. However, it is to be understood that other embodiments will become apparent to those of ordinary skill in the art upon reading this disclosure. The following detailed description is, therefore, not to be construed in a limiting sense, as the scope of the present disclosure is defined by the claims.

Figure 1A:
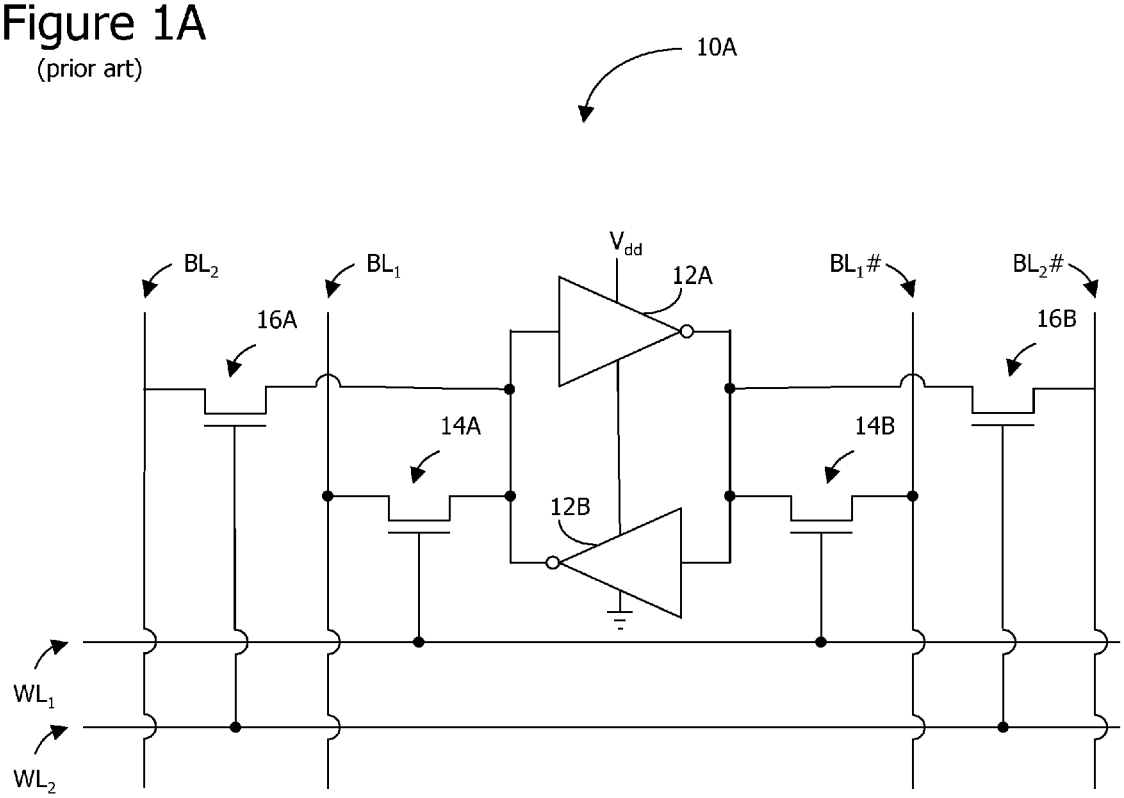
FIGS. 1A-1C are diagrams of an SRAM memory cell, according to the prior art.
Figure 1B:
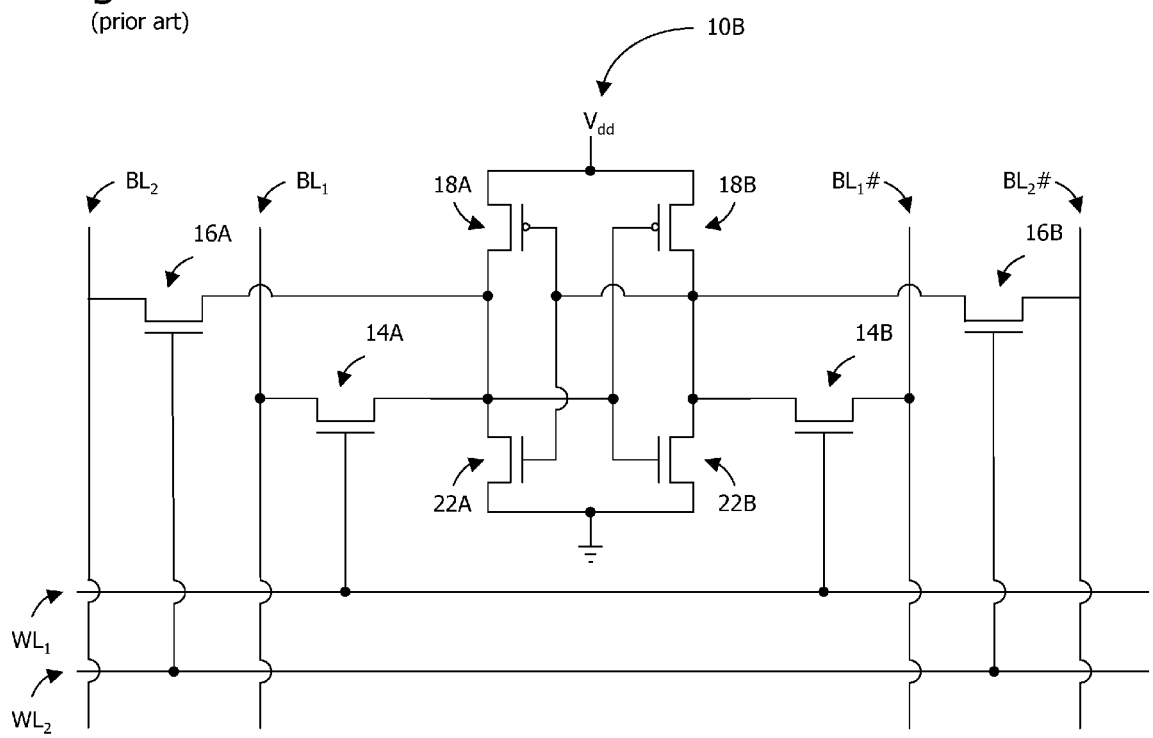
Figure 1C:
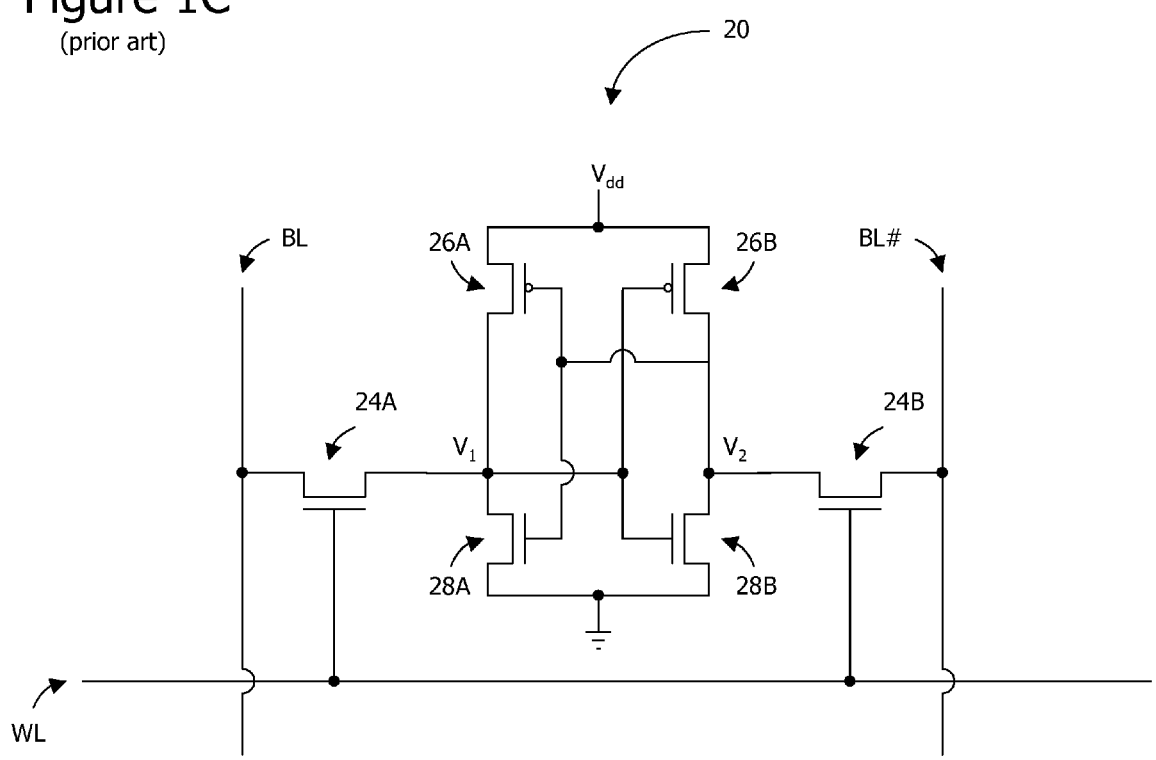

FIGS. 1A, 1B, and 1C are diagrams of a static random access memory (SRAM) cell, according to the prior art. The SRAM cell 10A (FIG. 1A) is a two-port memory cell, including two back-to-back inverters 12A and 12B, access transistors 14A and 14B (first port access), and access transistors 16A and 16B (second port access). For the first port access, complementary bitlines $BL_1$ and $BL_1\#$ are connected to the access transistors 14A and 14B, respectively, and wordline $WL_1$ is connected to the gates of the access transistors 14A and 14B. For the second port access, complementary bitlines $BL_2$ and $BL_2\#$ are connected to the access transistors 16A and 16B, respectively, and wordline $WL_2$ is connected to the gates of the access transistors. Bitlines $BL_1$ ($BL_2$) and $BL_1\#$ ($BL_2\#$) are known as complementary bitlines, since one bitline transmits a "1" or "0" value while the other bitline transmits its complement, a "0" or "1" value.

In the SRAM memory cell 10B (FIG. 1B), the inverters 12A and 12B are replaced with transistors 18A, 18B, 22A and 22B. (Since SRAM memory cell 10A and SRAM memory cell 10B are equivalent circuits, the circuit is referred to herein as SRAM memory cell 10 or memory cell 10.) The transistors in the memory cell 10 are metal oxide semiconductor field-effect transistors, or MOSFETs. Transistors 14A, 14B, 16A, 16B, 22A, and 22B are n-type MOSFETs, also known as NMOS transistors while transistors 18A and 18B are p-type MOSFETs, also known as PMOS transistors. The memory cell 10 has two ports, two sets of access transistors, and is thus known as a two-port cell.

A single-port memory cell is depicted in FIG. 1C, according to the prior art. The memory cell 20 includes a single wordline WL, a single pair of complementary bitlines BL and BL#, and a single pair of access transistors 24A and 24B, which are NMOS transistors. Transistors 26A and 26B are PMOS transistors while transistors 28A and 28B are NMOS transistors. The memory cell 20 thus consists of six MOSFETs, two PMOS transistors and four NMOS transistors.

The access transistors 24A and 24B are turned on by the activation of the wordline, WL, allowing access between the bitlines BL/BL# and the rest of the memory cell 20. When enabled, the access transistors 14A and 14B couple the bitlines BL and BL# to the complementary cell values, designated as $V_1$ and $V_2$ in FIG. 1C. The memory cell 20 value, $V_1$, is stored on one side of the cell (drain terminals of transistors 26A and 28A) while the complement of the memory cell value, $V_2$, is stored on the other side of the cell (drain terminals of transistors 26B and 28B). Whenever the memory cell 20 stores a "0" value ($V_1=0$), the voltage at the gate of the PMOS transistor 26B is negative (logic input "0"). The complementary voltage, $V_2$, is a "1" value, causing the voltage at the gate of the PMOS transistor 26A to be positive. Whenever the memory cell 20 stores a "1" value ($V_1=1$), the voltage at the gate of the PMOS transistor 26B is positive (logic input "1"). The complementary voltage, $V_2$, is a "0" value, causing the voltage at the gate of the PMOS transistor 26A to be negative (logic input "0"). Thus, according to the back-to-back arrangement of PMOS and NMOS transistors in a memory cell, one of the PMOS transistors will have a "0" value, or negative voltage, at a given time.

As described above, a PMOS transistor degrades when the voltage at its gate is negative, a phenomenon known as negative bias temperature instability (NBTI). A memory cell, such as the memory cells 10 and 20 described above, are unable to avoid the phenomenon, since one of the two PMOS transistors will have a negative voltage at a given point in time, due to the particular arrangement of the PMOS and NMOS transistors.

Figure 2:
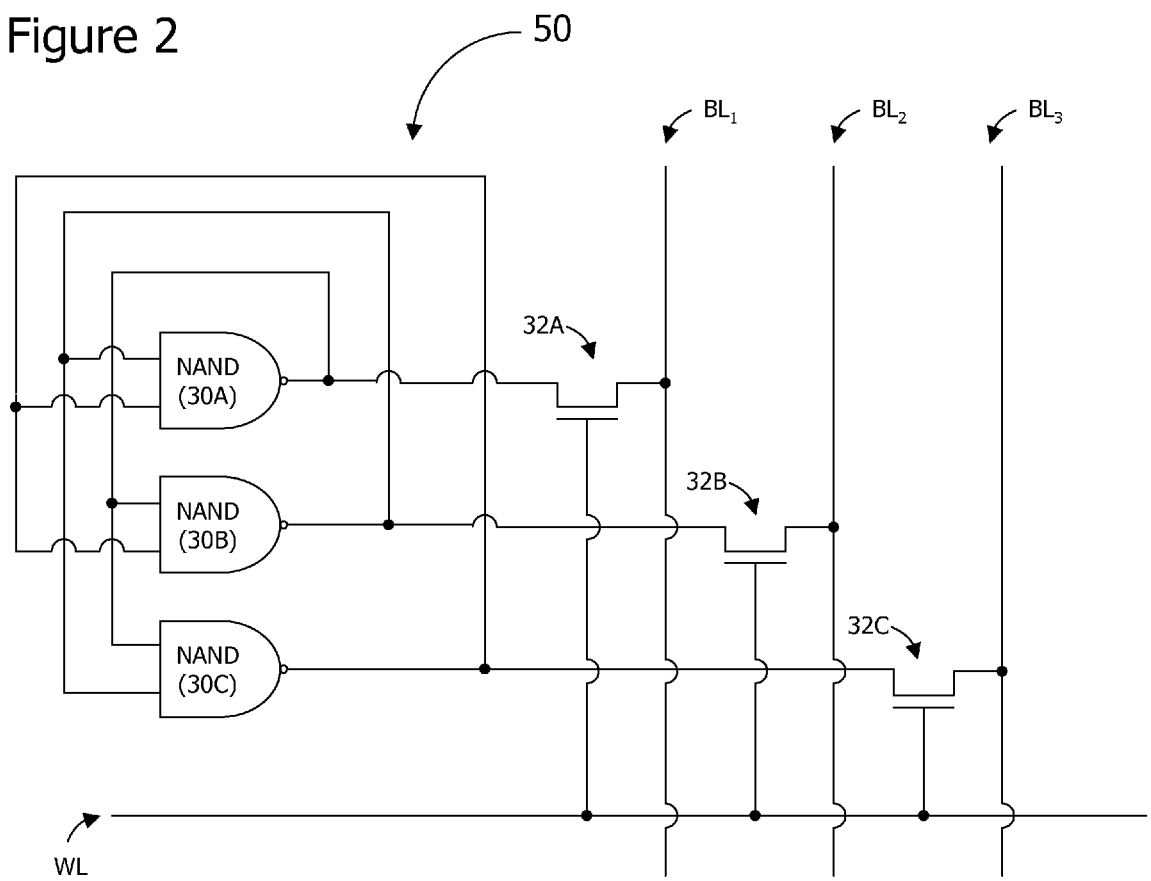
FIG. 2 is a diagram of a NAND-based memory cell, including three two-input NAND gates, according to some embodiments.

The lifetime of the memory cells 10 and 20 may be optimized such that there is a balance between the time when one PMOS transistor is degrading (18A or 26A) and the second PMOS transistor is degrading (18B or 26B). This balancing ensures that each PMOS transistor within the memory cell degrades during fifty percent of the time.

Where the memory cell includes more PMOS transistors, a similar balancing between each PMOS transistor may, in theory, reduce the effects of NBTI. For example, FIG. 2 is a NAND-based memory cell 50, according to some embodiments. The NAND-based memory cell 50, a single-port memory cell, includes three two-input NAND gates 30A, 30B, and 30C (collectively, NAND gates 30). The NAND gates 30 are arranged such that the output of one NAND gate is fed as an input into the other two NAND gates. With this configuration, whenever one NAND gate supplies a "0" value to its output, the remaining two NAND gates supply a "1" value. For example, when the NAND gate 30A supplies a "0" value to its output, the NAND gates 30B and 30C supply a "1" value to their outputs.

Three access transistors 32A, 32B, and 32C (collectively, access transistors 32) are connected to the outputs of the NAND gates 30A, 30B, and 30C, respectively, with a wordline WL gating the output of each NAND gate to a respective bitline $BL_1$, $BL_2$, or $BL_3$. In the configuration of FIG. 2, the memory cell 50 does not include complementary bitlines.

The memory cell 50 is a single-port memory cell. Additional ports may be supported, by adding bitlines (three per port), access transistors (three per port), and wordlines (one per port). (See FIGS. 1A and 1B for an example of a two-port memory cell.)

Figure 3:
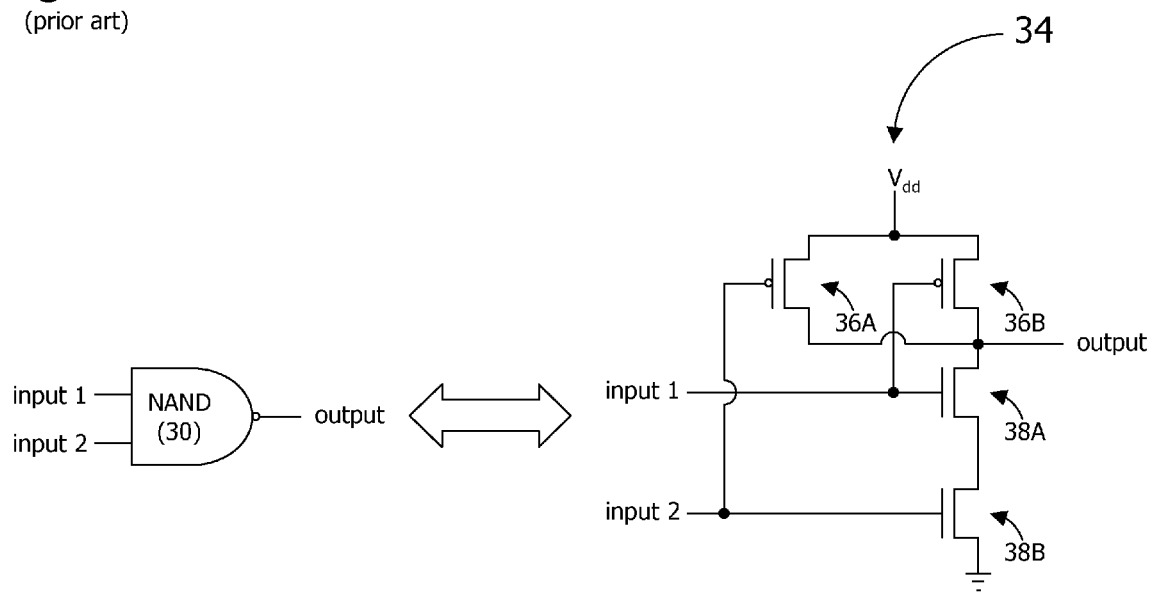
FIG. 3 is a diagram of a two-input NAND gate and an equivalent transistor circuit, according to the prior art.

Like the inverters 12A and 12B, the NAND gates 30A may be described using equivalent transistor circuits. In FIG. 3, a two-input NAND gate 30 is depicted, having a first input (input 1), a second input (input 2), and an output (output). An equivalent circuit 34 includes two PMOS transistors 36A and 36B and two NMOS transistors 38A and 38B, arranged as shown. The first input (input 1) is connected to the gate of the NMOS transistor 38A and the gate of the PMOS transistor 36B. The second input (input 2) is connected to the gate of the NMOS transistor 38B and the gate of the PMOS transistor 36A. The output (output) is connected to the drains of the PMOS transistors 36A and 36B and to the drain of the NMOS transistor 38A. A two-input NAND gate thus includes two PMOS transistors and two NMOS transistors.

As the circuit 34 shows, the PMOS transistor 36A is negative whenever the second input (input 2) is a logic "0". The PMOS transistor 36B is negative whenever the first input (input 1) is a logic "0". Thus, whenever either or both of the inputs to the NAND gate 30 are "0", some NBTI degradation of the NAND gate may occur.

Returning to FIG. 2, the arrangement of NAND gates 30 in the memory cell 50 ensures that whenever one NAND gate outputs a "0", the other two gates supply a "1". Since the output of each NAND gate 30 is tied to an input of each other NAND gate, this means that two out of six inputs, or one third, will have a "0", such that the PMOS transistors therein degrade 33% of the time, on average, rather than half the time, as in the conventional memory cell 10 or 20.

The memory cell 50 is larger than the memory cells 10 or 20; however, the memory cell 50 is more NTBI-resilient since it has more PMOS transistors. The novel memory cell 50 includes three NMOS access transistors 32, plus six PMOS transistors and six NMOS transistors (two of each from each NAND gate 30). In contrast to the memory cells 10 (FIGS. 1A and 1B) and 20 (FIG. 1C), which each have two PMOS transistors, the novel memory cell 50 has six PMOS transistors.

Each of the outputs of the NAND gates 30 in FIG. 2 are connected to the input of the other NAND gates in such a way that whenever one NAND gate supplies a "0" value to its output, the other two NAND gates supply a "1" value. This means that 33% of the PMOS transistors in the memory cell 50 degrade at a time. Table 1 details the inputs and outputs when the NAND gate 30A has a "1" value at both inputs.

TABLE 1

Inputs and outputs for the memory cell 50

|  | input 1 | input 2 | Output |
| --- | --- | --- | --- |
| NAND (30A) | 1 | 1 | 0 |
| NAND (30B) | 0 | 1 | 1 |
| NAND (30C) | 0 | 1 | 1 |

Figure 4:
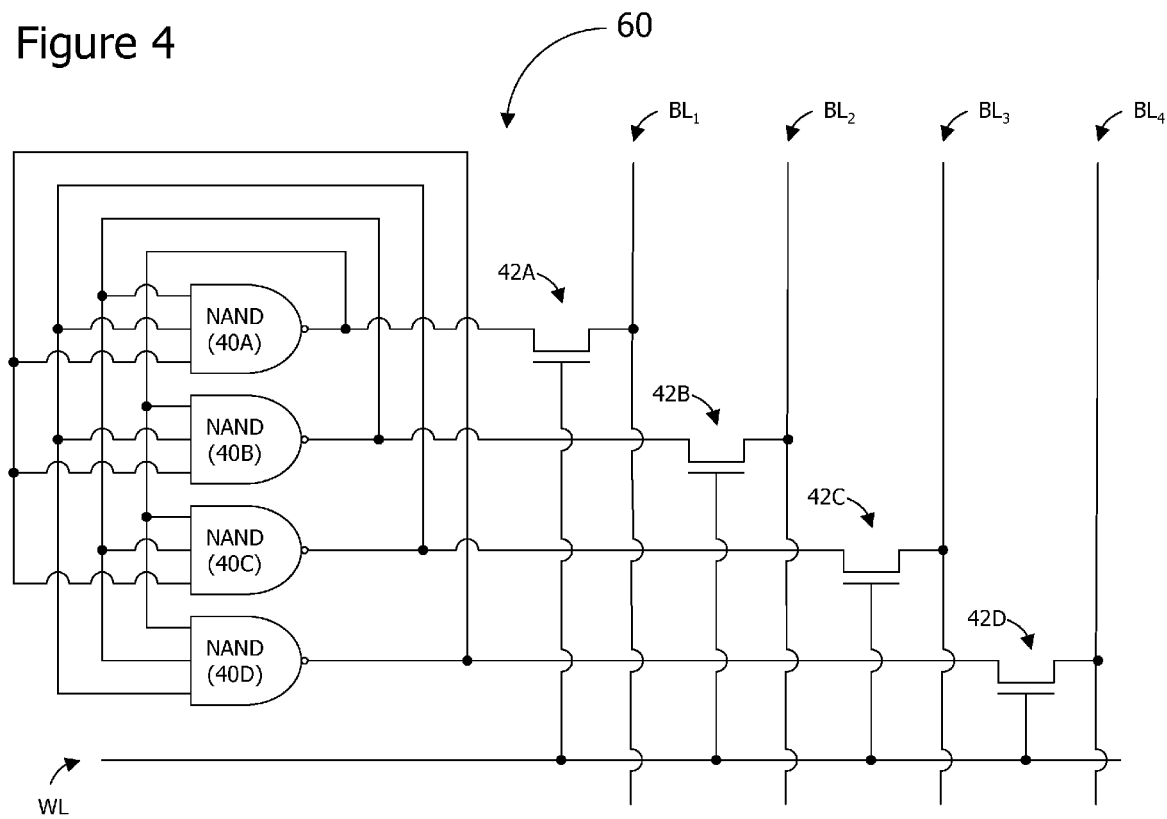
FIG. 4 is a diagram of a NAND-based memory cell, including four three-input NAND gates, according to some embodiments.

FIG. 4 depicts a second NAND-based memory cell 60, according to some embodiments. The NAND-based memory cell 60, a single-port memory cell, includes four three-input NAND gates 40A, 40B, 40C, and 40D (collectively, NAND gates 40). As in FIG. 2, the NAND gates 40 of the memory cell 60 are arranged such that the output of one NAND gate is fed as an input into the remaining NAND gates, in this case, three NAND gates. For example, when the NAND gate 40B outputs a "0" value, the NAND gates 40A, 40C, and 40D output a "1" value.

Four access transistors 42A, 42B, 42C, and 42D (collectively, access transistors 42) are connected to the outputs of the NAND gates 40A, 40B, 40C, and 40D respectively, with a wordline WL gating the output of each NAND gate to a respective bitline $BL_1$, $BL_2$, $BL_3$, or $BL_4$. In the configuration of FIG. 4, the memory cell 60 does not include complementary bitlines.

The memory cell 60 is a single-port memory cell. Additional ports may be supported, by adding bitlines (four per port), access transistors (four per port), and wordlines (one per port).

Figure 5:
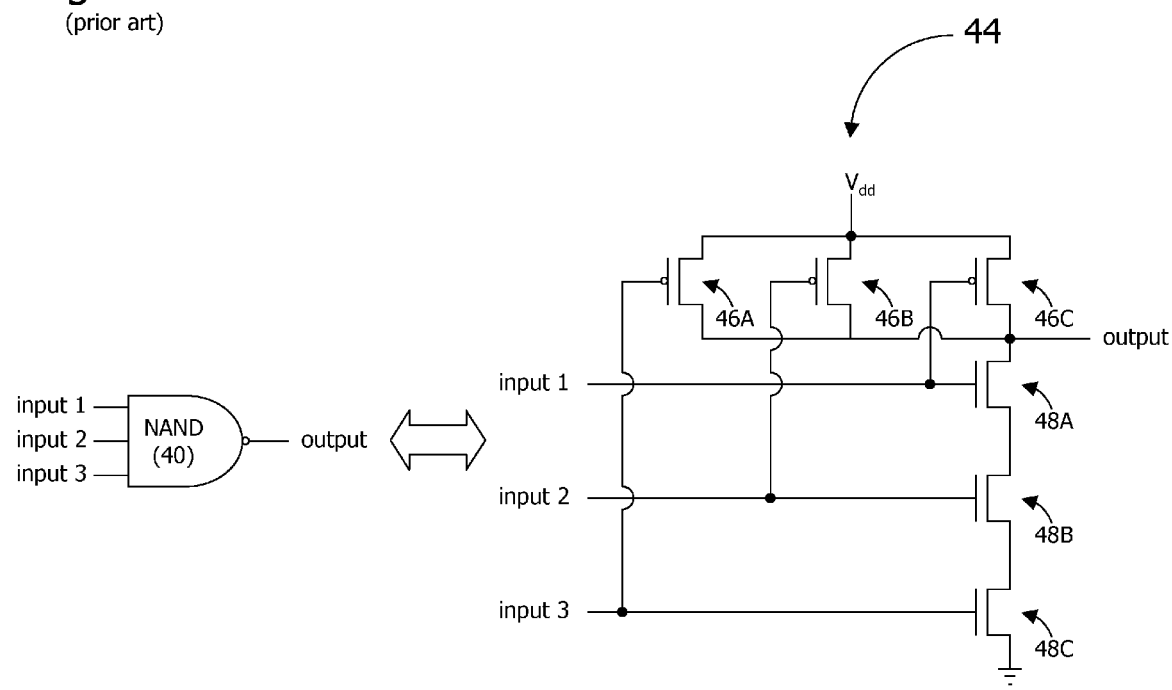
FIG. 5 is a diagram of a three-input NAND gate an equivalent transistor circuit, according to the prior art.

In FIG. 5, a three-input NAND gate 40 is depicted, having a first input (input 1), a second input (input 2), a third input (input 3) and an output (output). An equivalent circuit 44 includes three PMOS transistors 46A, 46B, and 46C and three NMOS transistors 48A, 48B, and 48C, arranged as shown. The first input (input 1) is connected to the gate of the NMOS transistor 48A and the gate of the PMOS transistor 46C. The second input (input 2) is connected to the gate of the NMOS transistor 48B and the gate of the PMOS transistor 46B. The third input (input 3) is connected to the gate of the NMOS transistor 48C and the gate of the PMOS transistor 46A. The output (output) is coupled to the drains of the PMOS transistors 46A, 46B, and 46C and to the drain of the NMOS transistor 48A. A three-input NAND gate thus includes three PMOS transistors and three NMOS transistors.

As the circuit 44 shows, the PMOS transistor 46A is negative whenever the third input (input 3) is a logic "0". The PMOS transistor 46B is negative whenever the second input (input 2) is a logic "0". The PMOS transistor 46C is negative whenever the first input (input 1) is a logic "0". Thus, whenever any of the inputs to the NAND gate 30 are "0", some NBTI degradation of the NAND gate may occur.

Returning to FIG. 4, the arrangement of NAND gates 40 in the memory cell 60 ensures that whenever one NAND gate outputs a "0", the other three gates supply a "1". Since the output of each NAND gate 40 is tied to an input of each other NAND gate, this means that three out of twelve inputs, or one fourth, will have a "0", such that the PMOS transistors therein degrade 25% of the time, on average, rather than half the time, as in the conventional memory cell 10 or 20, or 33% of the time, as in the NAND-based memory cell 50 (FIG. 2).

Each of the outputs of the NAND gates 40 in FIG. 4 are connected to the input of the other NAND gates in such a way that whenever one NAND gate supplies a "0" value to its output, the other three NAND gates supply a "1" value. This means that 25% of the PMOS transistors in the memory cell 60 degrade at a time. Table 2 details the inputs and outputs when the NAND gate 40A has a "1" value at all three inputs.

TABLE 2

Inputs and outputs for the memory cell 60

|  | input 1 | input 2 | input 3 | output |
|---|---|---|---|---|
| NAND 40A | 1 | 1 | 1 | 0 |
| NAND 40B | 0 | 1 | 1 | 1 |
| NAND 40C | 0 | 1 | 1 | 1 |
| NAND 40D | 0 | 1 | 1 | 1 |

The arrangement of the three 2-input NAND-based memory cell 50 and the four 3-input NAND-based memory cell 60 may likewise be extended to larger and larger configurations, as desired. With each addition of a NAND gate, additional PMOS transistors are present in the cell, such that the number of PMOS transistors is increased and the associated NBTI degradation may be decreased.

The memory cells 50 and 60 are larger than the memory cell 20. Excluding the access transistors, the single-port memory cell 30 (FIG. 1C) has four transistors (2 NMOS, 2 PMOS); the memory cell 50 (FIG. 2) has twelve transistors (6 NMOS, 6 PMOS); the memory cell 60 (FIG. 4) has twenty-four transistors (12 NMOS, 12 PMOS). As the number of NAND gates increases, the number of transistors likewise increases. A memory cell comprising five four-input NAND gates, arranged in a fashion similar to that shown in FIGS. 2 and 4, would have forty transistors (20 NMOS, 20 PMOS), for example.

Despite using more transistors than the conventional memory cell 20, there may still be benefits using the memory cells 50 or 60. For applications with a large number of ports, such as register files, for example, the overhead in terms of transistors becomes less noticeable. Table 3 compares the transistor overhead between the conventional memory cell and the four-NAND memory cell 60.

TABLE 3

Transistor overhead comparison table

| number of ports | memory cell 20 | memory cell 60 | relative overhead |
|---|---|---|---|
| 1 | 6 | 14 | 2.33x |
| 2 | 8 | 16 | 2.00x |
| 3 | 10 | 18 | 1.80x |
| 4 | 12 | 20 | 1.67x |
| 5 | 14 | 22 | 1.57x |
| 6 | 16 | 24 | 1.50x |
| 7 | 18 | 26 | 1.44x |
| 8 | 20 | 28 | 1.40x |
| 9 | 22 | 30 | 1.36x |
| 10 | 24 | 32 | 1.33x |

The memory cell 20 has four transistors, plus two more transistors per port for a single bit (4+2×numports). (For example, the two-port memory cell 10 in FIG. 1B has eight transistors.) The memory cell 60 has twenty-four transistors, plus four more transistors per port for two bits (12+2×numports per bit). As Table 3 shows, the larger the number of ports, the lower the relative overhead of memory cell 60 with respect to memory cell 20. (The numbers in Table 3 do not consider overhead due to bitlines and wordlines.)

Further, in addition to being arranged in the particular manner depicted in FIGS. 2 and 4, the memory cells 50 and 60 are operated so as to periodically change the value encoding so as to balance the degradation of each PMOS transistor, in some embodiments. Depending on the position of the inputs as all "1s" (or the output at "0") in each NAND gate, there exists a different state. When "1s" are in the first and second inputs of the NAND gate 30A, the memory cell 50 is in a first state; when "1s" are in the first and second inputs of the NAND gate 30B, the memory cell 50 is in a second state; when "1s" are in the first and second inputs of the NAND gate 30C, the memory cell 50 is in a third state. Similarly, there exist four possible states for the four-NAND memory cell 60.

The four-NAND memory cell 60 is thus capable of storing two bits, using the four different states. In some embodiments, the logic to encode and decode the four different states involves two levels of gates, a NOT gate, or inverter, plus a two-input NAND gate or a two-input NOR gate. The functions to map two bits, $X_0$ and $X_1$, into four states, $Y_0, Y_1, Y_2$, and $Y_3$, may be as follows, although other mapping functions are also feasible:

$$Y_3 = \overline{X_1 \cdot X_0} \quad Y_1 = \overline{\overline{X_1} \cdot X_0} \quad X_1 = \overline{Y_3 + Y_2}$$

$$Y_2 = \overline{X_1 \cdot \overline{X_0}} \quad Y_0 = \overline{\overline{X_1} \cdot \overline{X_0}} \quad X_0 = \overline{Y_3 + Y_1}$$

Because the three-NAND memory cell 50 has three states, this allows for the encoding of a single bit. In some embodiments, two three-NAND memory cells 50 are used together to form a three-bit memory unit. Because each memory cell stores three possible states, putting two three-NAND cells together enables nine possible states. Thus, using two three-NAND memory cells 50, with nine states, three bits may be encoded.

Figure 6:
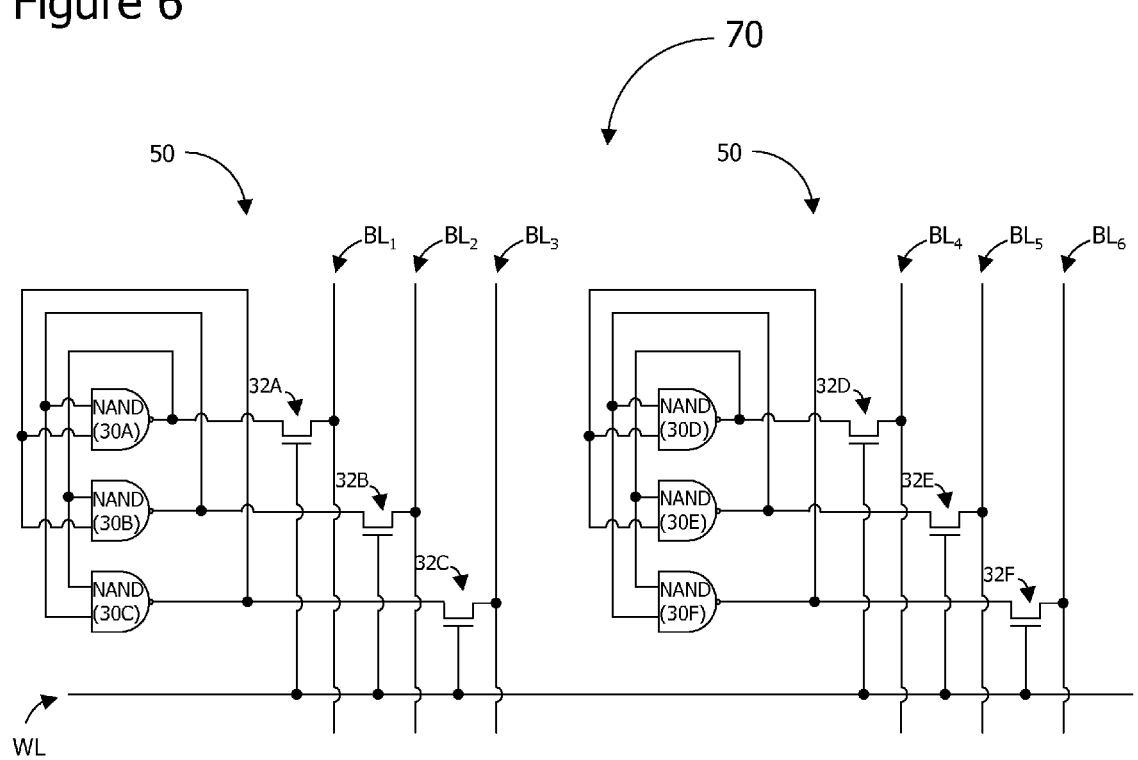
FIG. 6 is a diagram of a memory cell including two of the NAND-based memory cells of FIG. 2, according to some embodiments.

FIG. 6 is a memory cell 70, including two three-NAND memory cells 50 (FIG. 2), according to some embodiments. Because each of the three-NAND memory cells 50 stores three possible states, the two three-NAND memory cells combine to store nine possible states in the memory cell 70. With nine possible states, three bits may be encoded in the memory cell 70. The memory cell 70 may thus be thought of as a three-bit memory cell.

With the four-NAND memory cell 60, since four states are present, two bits may be encoded, without combining the memory cell with another memory cell. Thus, the four-NAND memory cell 60 (FIG. 5) is less complex than the two three-NAND memory cell 70 (FIG. 6), since there is no combination of memory cells to form new memory cells.

Table 4 summarizes the characteristics of the new memory cells, relative to the prior art memory cell. The number of transistors in the "transistors per cell" column does not include the access transistors used for port access.

TABLE 4

Transistors and bitlines for three memory cells

| | transistors per cell | transistors per bit | bitlines per cell (each port) | bitlines & transistors per bit (each port) |
|---|---|---|---|---|
| 2 NOT | 4 | 4 | 2 | 2 |
| 3 NANDs | 12 | 8 (3 bits in 2 cells) | 3 | 2 (3 bits in 2 cells) |
| 4 NANDs | 24 | 12 (2 bits in 1 cell) | 4 | 2 (2 bits in 1 cell) |

As Table 4 shows, while the number of transistors per memory cell increases with the three- and four-NAND configurations, the number of bitlines and transistors per bit remains consistent with the prior art memory cell, the two "NOT" or two inverters configuration of FIG. 1C.

The memory cell 70 (FIG. 6) includes six bitlines, $B_1$-$B_6$, three for each three-NAND memory cell 50. The conventional memory cell 20 (FIG. 1C) employs two bitlines and encodes a single bit. The memory cell 70, which encodes three bits, thus uses no more bitlines per bit than the memory cell 20. The memory cell 60 (FIG. 4) includes four bitlines, $B_1$-$B_4$. Since the memory cell 60 stores two bits, there are two bitlines for each bit.

In some embodiments, the states of the memory cells are inverted periodically, such that degradation in any one PMOS transistor is balanced with the degradation of other PMOS transistors in the memory cell. Such balancing of degradation may extend the lifetime of the memory cell. Instead of having two states (as in the memory cell 20), the state inversion is performed on three states in the three-NAND memory cell 50 (nine states in the three-bit memory cell 70), the state inversion is performed on four states in the four-NAND memory cell 60, and so on for larger and larger configurations. Whenever the state is changed, the mappings are rotated to balance the activity of the PMOS transistors within each memory cell. For example, the four-NAND memory cell 60 may map the value "00" as "0111" in the first state, "1011" in the second state, "1101" in the third state, and "1110" in the fourth state.

Memory cells are connected to circuitry that facilitates the transmission of signals to and from the memory cell. During a read operation, for example, a column decoder may receive the data from the relevant bitline pair and send the data to a sense amplifier. The sense amplifier amplifies the signal and sends the signal to input/output (I/O) buffers, for receipt by external circuitry. During a write operation, a write driver retrieves the data from the I/O buffers and sends the data to the relevant bitline pair.

Typically, the sense amplifiers used during a read operation are differential sense amplifiers, since the data is transmitted on complementary bitlines. In the memory cells 60 (four-NAND) and 70 (two three-NAND), complementary bitlines are not used. Thus, in some embodiments, single-ended sense amplifiers are used. With single-ended sense amplifiers, the conventional memory cell (e.g., memory cell 20) may work one bitline per cell. The NAND memory cells may include at least as many bitlines and sense amplifiers as number of NANDs per cell minus one. One bitline and associated sense amplifier may be eliminated. This is because, according to the configuration of the NAND gates, if all the bitlines are "1", then the remaining bitline is automatically a "0"; likewise, if one of the bitlines are "0", then the remaining bitline is automatically a "1". Thus, one of the bitlines may be inferred from the value of the other bitlines.

Figure 7A:
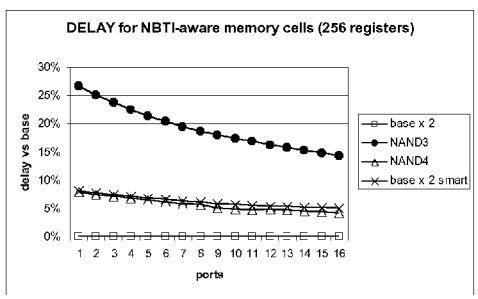
FIGS. 7A-7C are graphs comparing delay, area, and power, respectively, between different types of memory cells, according to some embodiments.
Figure 7C:
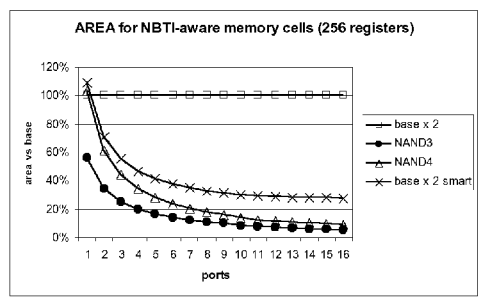
Figure 7B:
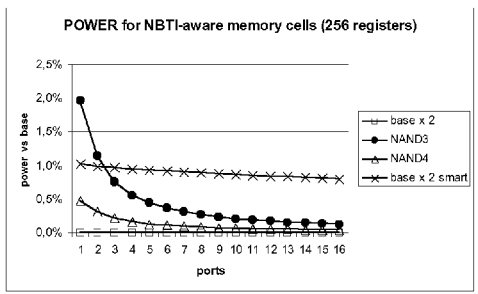

The three-NAND memory cell 70 and the four-NAND memory cell 60 have been analyzed, in terms of delay, area, and power overhead. FIGS. 7A, 7B, and 7C show the results of empirical tests done on the memory cell 70, the memory cell 60, and two other memory cells, described below, according to some embodiments. The measurements in each graph are taken relative to a "base" memory cell, the conventional memory cell 20. The resulting graphs 92, 94, and 96 illustrate delay, area, and power, respectively, for each cell having a different number of ports. The memory cell 70 is slower than the memory cell 60, because of the higher delay associated with the encode/decode mechanism in the memory cell 60. On the other hand, the memory cell 70 is smaller than the memory cell 60 because the memory cell 70 has fewer transistors per bit than the memory cell 60.

Figure 8:
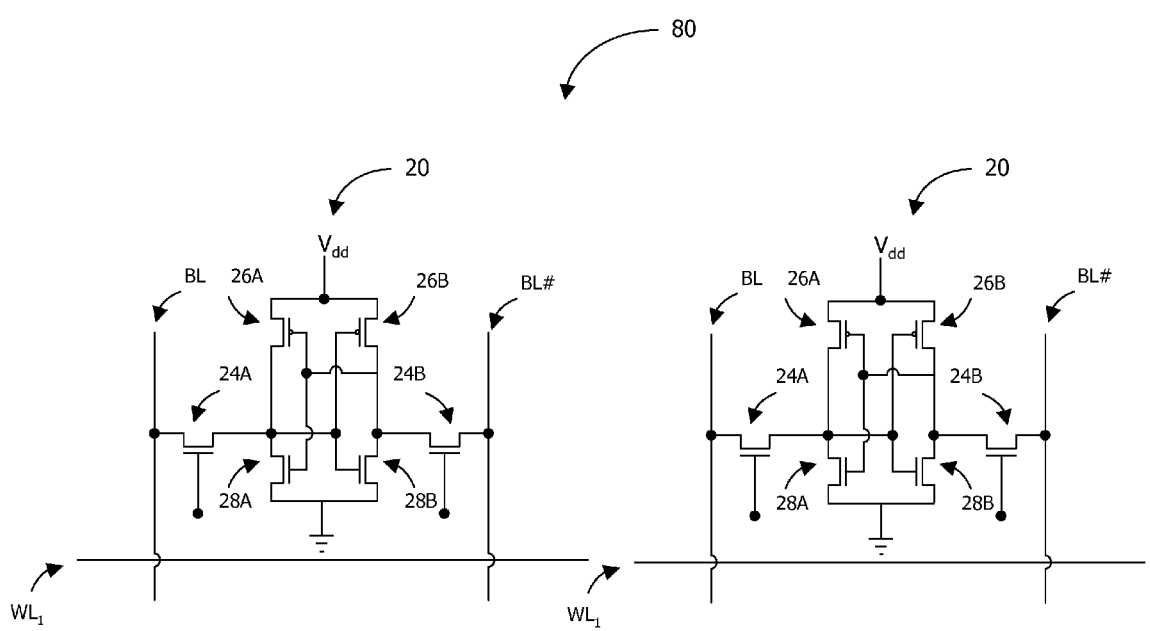
FIG. 8 is a diagram of a memory cell including the memory cell of FIG. 1C duplicated entirely, according to some embodiments.

A memory cell 80 is depicted in FIG. 8, according to some embodiments. Known in the graphs as "base×2", the memory cell 80 is a replication of the entire memory cell 20 (FIG. 1C), including bitlines and wordline. The memory cell 80, implemented with conventional memory cells, is included in the graph to extend the lifetime of a typical prior art memory cell by two times. (This assumes that the lifetime may be extended for free in terms of delay and power.) In the graphs 92, 94, and 96, the memory cell 80, "base×2", is graphed using hollow squares.

Figure 9:
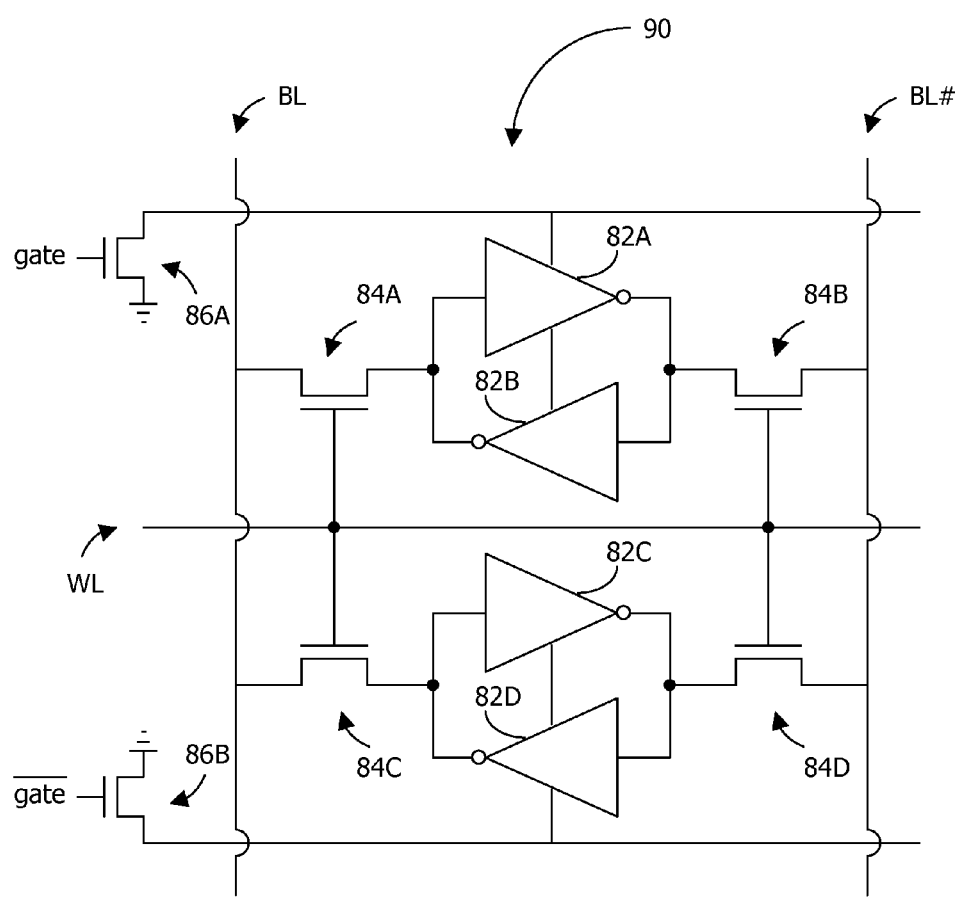
FIG. 9 is a diagram of a memory cell including the memory cell of FIG. 1C duplicated not entirely, according to some embodiments.

The three-NAND memory cell 70 is known in the graphs as "NAND3", and is graphed using solid circles. The four-NAND memory cell 60 is known in the graphs as "NAND4", and is graphed using hollow triangles. A fourth memory cell, known as "base×2 smart", is graphed using "crosses". An example of the "base×2 smart" memory cell is depicted in FIG. 9. In contrast to the memory cell 80 (FIG. 8), the memory cell 90 replicates much of the circuitry of the memory cell 20 (FIG. 1C), except for the ports. The memory cell 90 also employs a gated-$V_{dd}$ technique to periodically change the cells on use. The memory cell 90 employs eight transistors per cell (twice the base case), four transistors per port to control both cells (twice the base case and twice the NAND cells case) and the wires and transistors used to implement gated-$V_{dd}$, to turn on/off one or the other cell.

The graphs 92, 94, and 96 are plots of measured results for a register file having 256 registers, each measurement being taken for memory cells with a different number of ports. Using the three-NAND memory cell 70 (FIG. 6) or the four-NAND memory cell 60 (FIG. 4), the graphs show that there is some overhead in terms of delay (graph 92) and area (graph 96), but, for a large number of ports, the overhead is not as noticeable. In the graph 92, the results for the memory cell 60 (NAND4) are close to the results for the memory cell 90 (base×2 smart). As the number of ports increase, the memory cell 60 is less than 5% away from the delay in the base case (e.g., memory cell 20).

In terms of power (FIG. 7B), the graph 94 shows that, as the number of ports increase, the difference between the NAND-based memory cells and the base case, particularly the four-NAND memory cell, are minimal. In terms of area (FIG. 7C), the graph 96 shows that, once the number of ports is increased, the NAND-based memory cells perform better than the memory cell 80 (base×2) and the memory cell 90 (base×2 smart). Where a system uses a large number of ports, the NAND-based memory cells perform well, compared to the prior art memory cells.

As shown in the graph 92, the overhead in terms of delay for the memory cell 70 (NAND3) is high, but is low for the memory cell 60 (NAND4). For example, for nine ports, the delay of the register file (256 registers) is increased by 5%. Increasing the register file access time usually does not have an impact on overall processor performance. In some embodiments, additional guardband shrinking provides extra performance benefits by increasing the operating frequency by far more than 5%.

In the power graph 94, the overhead is negligible, below 0.5% using the memory cell 60 (4NANDs) for any number of ports, and below 1% for most cases. In the area graph 96, the NAND-based memory cells perform better, except for single-port structures. For example, the register with memory cells 60 (4NANDs) with nine ports increases the area by 16%, which is much less than replicating the whole register file (base×2) or replicating the memory cells (base×2 smart).

It has been shown that, using conventional memory cells (e.g., memory cell 20 in FIG. 1C), the lifetime of the memory cell may be increased by four times by reducing the amount of time with negative voltage at the gate of PMOS transistors from 100% of the time to 50% of the time. Thus, in some embodiments, the three-NAND and four-NAND configurations may achieve at least these results, and should perform better (33% and 25%, respectively) because of the self-healing effect of NBTI when the voltage at the gate of the PMOS transistors is not negative. As shown in the graphs, replicating the whole register file (base×2) or just replicating the memory cells (base×2 smart) extends the lifetime by twice with a higher area overhead than with the NAND-based memory cells.

In addition to register cells, the memory cells 50 and 60 may be used in any memory-like structure, such as queues and caches. Although the structure of the memory cells 50 and 60 are suitable for highly ported structures, such as register files, buffers, and queues, the memory cells 50 and 60 may also be used in memory structures existing inside the cores and the uncore of many processors.

Figure 10:
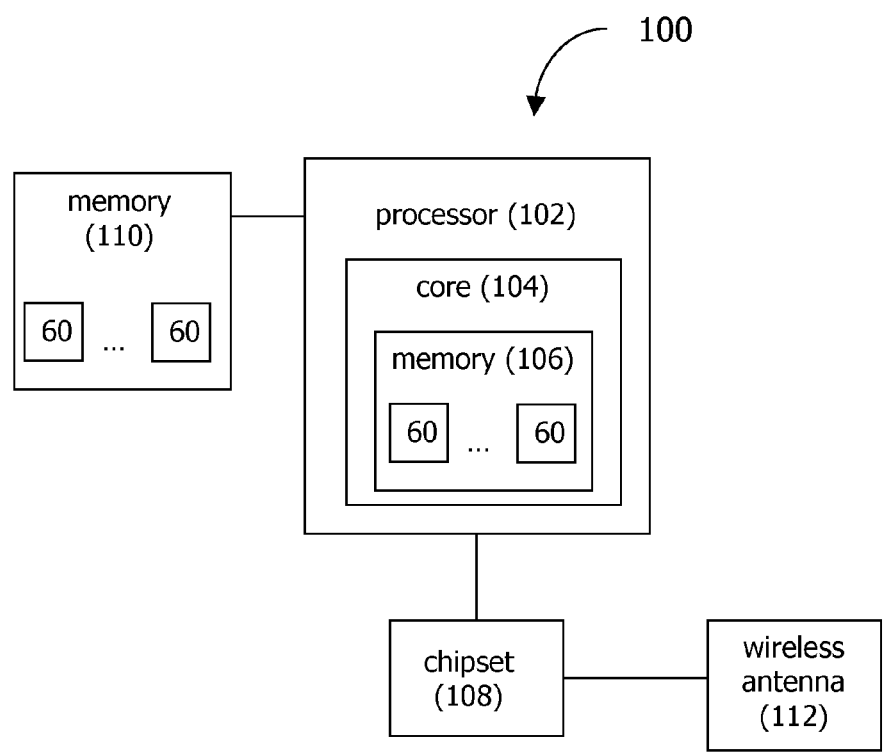
FIG. 10 is a block diagram of a processor-based system using the memory cells of FIG. 4, according to some embodiments.

In FIG. 10, a processor-based system 100 is depicted, according to some embodiments. The processor-based system 100 includes a processor 102, which includes a core 104 with a memory 106. The memory 106 includes memory cells 60, the four-NAND memory configuration described above. Also coupled to the processor 102 is an external memory 110. The external memory also includes the memory cells 60. The processor 102 is further coupled to a chipset 108, which includes a wireless antenna 112.

While the disclosure has been described with respect to a limited number of embodiments, those skilled in the art will appreciate numerous modifications and variations therefrom. It is intended that the appended claims cover all such modifications and variations as fall within the true spirit and scope of the disclosed subject matter.

We claim:

1. A memory cell, comprising:
   a plurality of NAND gates comprising at least two inputs, each NAND gate further comprising:
      a first p-type transistor and a second p-type transistor;
      a first n-type transistor and a second n-type transistor;
      a first input;
      a second input; and
      an output;
   wherein the output of a first NAND gate of the plurality of NAND gates is coupled to one of the at least two inputs of each of the other NAND gates of the plurality of NAND gates;
      a plurality of access transistors, one for each of the other NAND gates, wherein the output of each other NAND gate is coupled to a source or drain of the associated access transistor; and
      a plurality of bitlines, one for each of the other NAND gates, wherein the plurality of access transistors couple the output of each other NAND gate to one of the plurality of bitlines.

2. The memory cell of claim 1, further comprising:
   a plurality of states, the number of states being equal to the number of NAND gates, wherein the states are periodically inverted such that degradation in the first p-type transistor is balanced with degradation in the second p-type transistor.

3. The memory cell of claim 2, further comprising:
   a wordline coupled to a gate of each of the plurality of access transistors.

4. The memory cell of claim 3, each of the plurality of NAND gates further comprising:
   a third p-type transistor;
   a third n-type transistor; and
   a third input.

5. The memory cell of claim 3, further comprising:
   a second plurality of NAND gates comprising a second NAND gate and remaining NAND gates, each NAND gate comprising at least two inputs, each NAND gate further comprising:
      a first p-type transistor and a second p-type transistor;
      a first n-type transistor and a second n-type transistor;
      a first input;
      a second input; and
      an output; and
   a second plurality of access transistors, one for each of the remaining NAND gates, wherein the output of the remaining NAND gates is coupled to a source or drain of the associated access transistor;
   wherein the output of the second NAND gate of the second plurality of NAND gates is coupled to one of the at least two inputs of each of the remaining NAND gates of the second plurality of NAND gates.

6. The memory cell of claim 5, further comprising:
   a second plurality of bitlines, one for each of the remaining NAND gates;
   wherein the second plurality of access transistors couple the output of each of the remaining NAND gates to one of the second plurality of bitlines.

7. The memory cell of claim 3, further comprising:
   a second wordline;
   a second plurality of access transistors, one for each of the NAND gates; and
   a second plurality of bitlines, one for each of the NAND gates;

wherein the second plurality of access transistors couple the output of each of the NAND gates to one of the second plurality of bitlines.

8. The memory cell of claim 4, further comprising:
   a second wordline;
   a second plurality of access transistors, one for each of the NAND gates; and
   a second plurality of bitlines, one for each of the NAND gates;
wherein the second plurality of access transistors couple the output of each of the NAND gates to one of the second plurality of bitlines.

9. The memory cell of claim 6, further comprising:
   a second wordline;
   a second plurality of access transistors, one for each of the NAND gates; and
   a second plurality of bitlines, one for each of the NAND gates;
wherein the second plurality of access transistors couple the output of each of the NAND gates to one of the second plurality of bitlines.

10. A memory cell, comprising:
    a plurality of NAND gates arranged such that the output of one NAND gate is coupled to an input of the other NAND gates;
    a plurality of bitlines coupled to the outputs of each of the plurality of NAND gates; and
    a plurality of access transistors coupled between the outputs of each of the plurality of NAND gates, not including the one NAND gate, and the plurality of bitlines, each NAND gate having an associated access transistor, wherein the output of the NAND gate is not coupled to a gate of its associated access transistor, but is coupled to either a source or a drain of the associated access transistor.

11. The memory cell of claim 10, each NAND gate of the plurality of NAND gates comprising two inputs, wherein the memory cell comprises three valid states.

12. The memory cell of claim 11, each NAND gate of the plurality of NAND gates comprising two p-type transistors, wherein each p-type transistor degrades one-third of the time.

13. The memory cell of claim 10, each NAND gate of the plurality of NAND gates comprising three inputs, wherein the memory cell comprises four valid states.

14. The memory cell of claim 13, each NAND gate of the plurality of NAND gates comprising three p-type transistors, wherein each p-type transistor degrades one-fourth of the time.

15. The memory cell of claim 10, further comprising:
    a second plurality of bitlines coupled to the outputs of each of the plurality of NAND gates, not including the one NAND gate; and
    a second plurality of access transistors coupled between the outputs of each of the plurality of NAND gates, not including the one NAND gate, and the plurality of bitlines.

16. The memory cell of claim 12, further comprising:
    a second plurality of NAND gates arranged such that the output of one NAND gate is coupled to an input of the other NAND gates;
    a second plurality of bitlines coupled to the outputs of each of the plurality of NAND gates, not including the one NAND gate; and
    a second plurality of access transistors coupled between the outputs of each of the plurality of NAND gates, not including the one NAND gate, and the plurality of bitlines.

17. The memory cell of claim 16, each NAND gate of the second plurality of NAND gates comprising two inputs, wherein the memory cell comprises nine valid states.

18. A processor-based system, comprising:
    a processor to execute instructions;
    a chipset coupled to the processor;
    a wireless antenna coupled to the chipset; and
    a core disposed within the processor, the core comprising a memory, the memory comprising a plurality of memory cells, each memory cell comprising:
        a plurality of NAND gates comprising at least two inputs, each NAND gate further comprising:
            a first p-type transistor and a second p-type transistor;
            a first n-type transistor and a second n-type transistor;
            a first input;
            a second input; and
            an output;
    wherein the output of one of the plurality of NAND gates is coupled to one of the at least two inputs of each of the other of the plurality of NAND gates;
        a plurality of access transistors, one for each of the other NAND gates, wherein the output of each other NAND gate is coupled to a source or drain of the associated access transistor; and
        a plurality of bitlines, one for each of the other NAND gates, wherein the plurality of access transistors couple the output of each other NAND gate to one of the plurality of bitlines.

19. The processor-based system of claim 18, each memory cell further comprising:
    a third p-type transistor;
    a third n-type transistor; and
    a third input.

20. The processor-based system of claim 18, each memory cell further comprising:
    a second plurality of NAND gates, each comprising:
        a first p-type transistor and a second p-type transistor;
        a first n-type transistor and a second n-type transistor;
        a first input;
        a second input; and
        an output;
wherein the output of one of the second plurality of NAND gates is coupled to one of the inputs of the other of the second plurality of NAND gates.

* * * * *